(12) United States Patent
Tsubamoto

(10) Patent No.: US 8,352,897 B2
(45) Date of Patent: Jan. 8, 2013

(54) CALCULATING WAVEFORM DETERIORATION AMOUNT FOR DETERMINING PIN PLACEMENT

(75) Inventor: Daita Tsubamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 34 days.

(21) Appl. No.: 13/071,654

(22) Filed: Mar. 25, 2011

(65) Prior Publication Data

US 2011/0246957 A1    Oct. 6, 2011

(30) Foreign Application Priority Data

Mar. 30, 2010    (JP) .................................... 2010-79628

(51) Int. Cl.
 *G06F 17/50*    (2006.01)

(52) U.S. Cl. .......................... 716/115; 716/111; 702/69

(58) Field of Classification Search .................. 716/111, 716/115; 702/69
See application file for complete search history.

(56) References Cited

U.S. PATENT DOCUMENTS

| 5,029,250 | A  | * | 7/1991  | Komatsu et al. ............... 250/310 |
| 6,972,380 | B2 | * | 12/2005 | Lee ................................ 174/255 |
| 7,280,953 | B2 | * | 10/2007 | Fujimori et al. ................ 703/14 |
| 2004/0005816 | A1 | * | 1/2004 | Sato et al. ...................... 439/620 |
| 2008/0077892 | A1 | * | 3/2008 | Yamazaki et al. ................ 716/4 |
| 2008/0155489 | A1 | * | 6/2008 | Komatsu et al. ................ 716/10 |
| 2009/0168859 | A1 | * | 7/2009 | Tsubamoto et al. .......... 375/224 |
| 2010/0057389 | A1 | * | 3/2010 | Tsubamoto et al. ............ 702/69 |

FOREIGN PATENT DOCUMENTS

| JP | 2004-265436 | 9/2004 |
| JP | 2005-149445 | 6/2005 |
| JP | 2009-245129 | 10/2009 |

* cited by examiner

*Primary Examiner* — Naum Levin
(74) *Attorney, Agent, or Firm* — Squire Sanders (US) LLP

(57) ABSTRACT

A pin placement determining method includes calculating a waveform deterioration amount of wires from a noise amount of the wires and wiring loss of the wires, the wires being coupled to a connector on a printed board, comparing the calculated waveform deterioration amount of the wires to an evaluation criteria, evaluating the wires in which the waveform deterioration amount exceeds the evaluation criteria, and replacing corresponding pins of the connectors to which the wires that have been evaluated as exceeding the evaluation criteria are coupled with replacement pins of connectors that have a low noise amount.

10 Claims, 26 Drawing Sheets

FIG. 5

| NET NUMBER | CONNECTING TERMINAL 1 | | | CONNECTING TERMINAL 2 | | |
|---|---|---|---|---|---|---|
| | COMPONENT | TERMINAL | INPUT/OUTPUT TYPE | COMPONENT | TERMINAL | INPUT/OUTPUT TYPE |
| 1 | IC1 | P1 | OUTPUT | CONNECTOR(1) | P5 | INPUT |
| 2 | CONNECTOR(2) | P5 | OUTPUT | CONNECTOR(3) | P10 | INPUT |
| 3 | CONNECTOR(3) | P10 | OUTPUT | IC2 | P10 | INPUT |

FIG. 7

| COMPONENT NUMBER | REFERENCE POINT COORDINATES ||
|---|---|---|
| | X | Y |
| CONNECTOR(2) | 5 | 10 |
| CONNECTOR(3) | 25 | 20 |

FIG. 9A

|   | ROW A | ROW B | ROW C | ROW D |
|---|---|---|---|---|
| 1 | GROUP A | GROUP A | GROUP B | GROUP B |
| 2 | GROUP A | GROUP A | GROUP B | GROUP B |
| 3 | GROUP A | GROUP A | GROUP B | GROUP B |
| 4 | GROUP A | GROUP A | GROUP B | GROUP B |

FIG. 9B

|   | ROW A | ROW B | ROW C | ROW D |
|---|---|---|---|---|
| 1 | GROUP A |  | GROUP B | GROUP B |
| 2 | GROUP A |  | GROUP B | GROUP B |
| 3 | GROUP A | GROUP A |  | GROUP B |
| 4 | GROUP A | GROUP A |  | GROUP B |

FIG. 10

| EVALUATION CRITERIA |
|---|
| AMOUNT OF WAVEFORM DETERIORATION :    XX dB |

FIG. 19

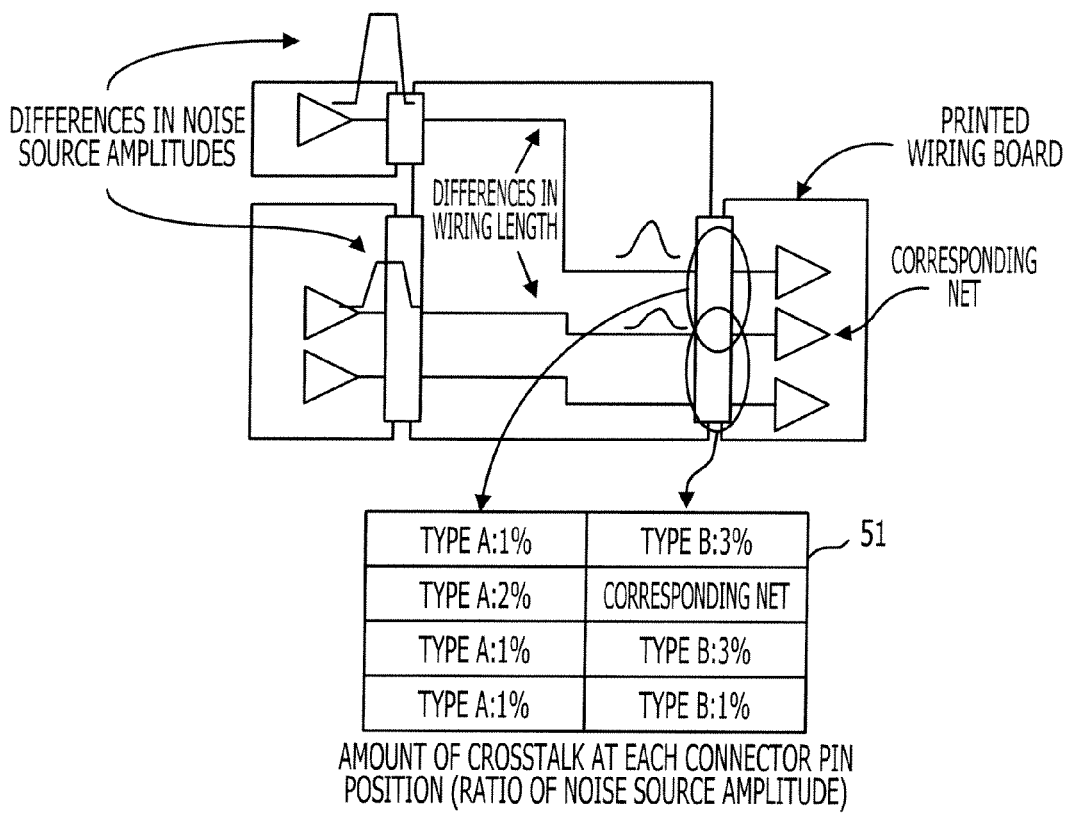

AMOUNT OF CROSSTALK AT EACH CONNECTOR PIN
POSITION (RATIO OF NOISE SOURCE AMPLITUDE)

⇩ TOTAL OF EACH TYPE

TYPE A TOTAL: 5%  TYPE B TOTAL: 7%

⇩ CONVERT TO PERCENTAGE

TYPE A PERCENTAGE: 42%  TYPE B PERCENTAGE: 58% WHEN
CONVERTED TO PERCENTAGE OF TOTAL AMOUNT OF CROSSTALK

⇩ NOISE SOURCE AMPLITUDE AND WIRING LENGTH
IS EQUALIZED BASED ON PERCENTAGES, AND
NOISE SOURCE AMPLITUDE AND WIRING LENGTH
ARE INTEGRATED

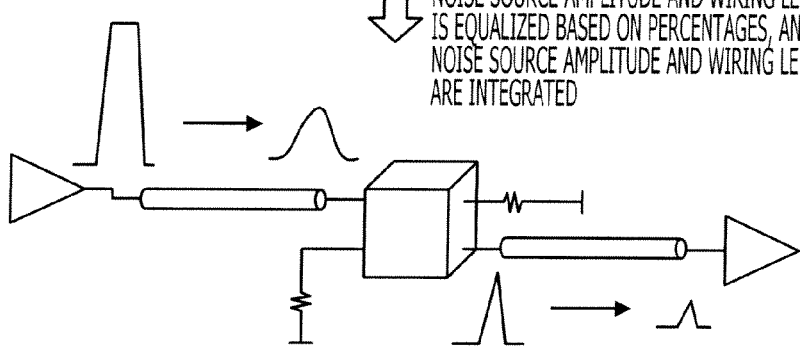

FINAL NOISE AMOUNT IS DERIVED WITH WAVEFORM SIMULATION
FROM SIMPLIFIED MODEL ACCORDING TO INTEGRATION

FIG. 20
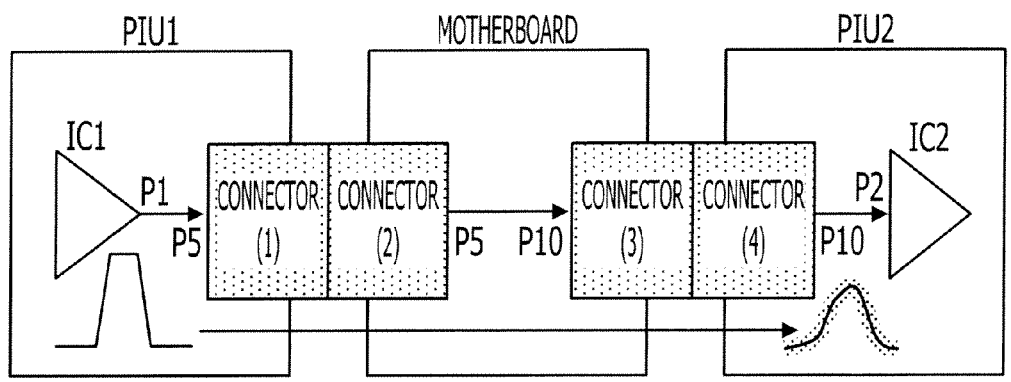
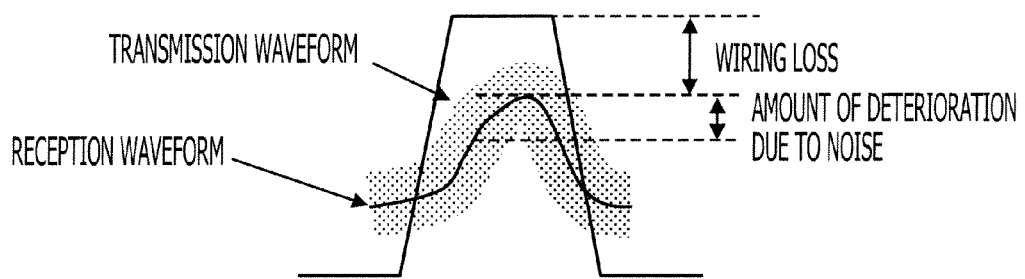

FIG. 23A

BEFORE PIN REPLACEMENT

| CONDITIONS | | | | | AMOUNT OF WAVEFORM DETERIORATION CALCULATIONS | | | | |
|---|---|---|---|---|---|---|---|---|---|
| OUTPUT AMPLITUDE (mV) | WIRING LENGTH (mm) | LOSS COEFFICIENT (dB/mm) | NOISE (mV) | RECEPTION AMPLITUDE (mV) | LOSS (dB) | NOISE (mV) | TOTAL (dB) | CRITERIA VALUE | EVALUATION |
| 800 | 500 | 0.02 | 50 | 200 | 10.0 | 2.9 | 12.9 | 12.0 | × |
| 800 | 50 | 0.02 | 10 | 200 | 1.0 | 1.2 | 2.2 | 12.0 | ○ |

MAXIMUM VALUE OF TOTAL AMOUNT OF WAVEFORM DETERIORATION:12.9(dB)

FIG. 23B

AFTER PIN REPLACEMENT

| CONDITIONS | | | | | AMOUNT OF WAVEFORM DETERIORATION CALCULATIONS | | | | |
|---|---|---|---|---|---|---|---|---|---|
| OUTPUT AMPLITUDE (mV) | WIRING LENGTH (mm) | LOSS COEFFICIENT (dB/mm) | NOISE (mV) | RECEPTION AMPLITUDE (mV) | LOSS (dB) | NOISE (mV) | TOTAL (dB) | CRITERIA VALUE | EVALUATION |
| 800 | 500 | 0.02 | 10 | 200 | 10.0 | 1.6 | 11.6 | 12.0 | ○ |
| 800 | 50 | 0.02 | 50 | 200 | 1.0 | 2.6 | 3.6 | 12.0 | ○ |

MAXIMUM VALUE OF TOTAL AMOUNT OF WAVEFORM DETERIORATION:11.6(dB)

EFFECT IS EVALUATED BASED ON MAXIMUM VALUE OF TOTAL AMOUNT OF WAVEFORM DETERIORATION BEFORE REPLACING PINS (12.9 dB) > MAXIMUM VALUE OF TOTAL AMOUNT OF WAVEFORM DETERIORATION AFTER REPLACING PINS (11.6 dB)

FIG. 25

| POSITION | SIGNAL NAME | AMOUNT OF WAVEFORM DETERIORATION(dB) | EVALUATION CRITERIA NOT ACCEPTABLE |
|---|---|---|---|
| 1 | b | 15 | O |
| 2 | h | 13 | O |
| 3 | a | 12 | O |
| 4 | f | 9 | |
| 5 | g | 8 | |
| 6 | e | 6 | |
| 7 | c | 4 | |
| 8 | i | 3 | |
| 9 | d | 1 | |

CRITERIA (between rows 3 and 4)

CALCULATING WAVEFORM DETERIORATION AMOUNT FOR DETERMINING PIN PLACEMENT

CROSS-REFERENCE TO RELATED APPLICATIONS

This application is based upon and claims the benefit of priority of the prior Japanese Patent Application No. 2010-79628, filed on Mar. 30, 2010, the entire contents of which are incorporated herein by reference.

FIELD

The embodiments discussed herein are related to a pin placement determining method for determining a connector pin placement.

BACKGROUND

Recently, the amount of information processing demanded of digital electronic devices is increasing. Similarly, the signal speeds inside digital electronic devices are becoming faster. The amount of wiring inside the digital electronic devices is also increasing. Japanese Laid-open Patent Publication No. 2009-245129 discloses a method for automatically determining placement of signal terminals during the design of printed boards in digital electronic devices.

SUMMARY

According to an embodiment, a pin placement determining method includes calculating a waveform deterioration amount of wires from a noise amount of the wires and wiring loss of the wires, with the wires being coupled to a connector on a printed board. The calculated waveform deterioration amount of the wires is compared to an evaluation criteria. The wires in which the waveform deterioration amount exceeds the evaluation criteria are evaluated, and corresponding pins of the connectors to which the wires that have been evaluated as exceeding the evaluation criteria are coupled are replaced with replacement pins of connectors that have a low noise amount.

The object and advantages of the invention will be realized and attained by at least the features, elements, and combinations particularly pointed out in the claims.

It is to be understood that both the foregoing general description and the following detailed description are exemplary and explanatory and are not restrictive of the invention as claimed.

BRIEF DESCRIPTION OF DRAWINGS

FIG. 5 is a diagram of a netlist indicating connection information.

FIG. 7 is a diagram indicating coordinate information of a PIU placement.

FIGS. 9A and 9B illustrate pin placements when "Adjacent to a different wiring group" or "Not adjacent to a different wiring group" is selected as the basic pin placement rule.

FIG. 10 illustrates a screen for inputting evaluation criteria.

FIG. 19 illustrates a process for calculating the amount of noise.

FIG. 20 illustrates a process for calculating the amount of waveform deterioration.

FIGS. 23A and 23B illustrate evaluation processing in step S8.

FIG. 25 illustrates a process of switching all the pins with a waveform deterioration amount exceeding the evaluation criteria with the same number of pins with less amounts of noise.

DESCRIPTION OF EMBODIMENTS

The conventional method of automatically determining positions for placing signal terminals consists of calculating the total of the differences in signal strength between signal terminals temporarily placed adjacent to each other on a board, and then making the temporary placement with the lowest total the final placement. The conventional method does not consider signal loss and the effect of noise on the signals when automatically determining the signal terminal placement.

Therefore, a designer decides temporary connector pin placements and then verifies the placement using a waveform simulator or the like in order to determine the connector pin placement while considering signal loss and the effect of noise on the signals. If the result of the verification cannot be allowed, the designer reconfigures the temporary connector pin placement and redoes the verification.

A first embodiment of the present invention provides a pin placement determining program, a pin placement determining device, and a pin placement determining method that can easily decide connector pin placements while considering signal loss and the effect of noise on signals.

The pin placement determining device according to the present embodiment may be applicable to another device that determines connector pin placements such as a design CAD device or the like.

Figure 1:
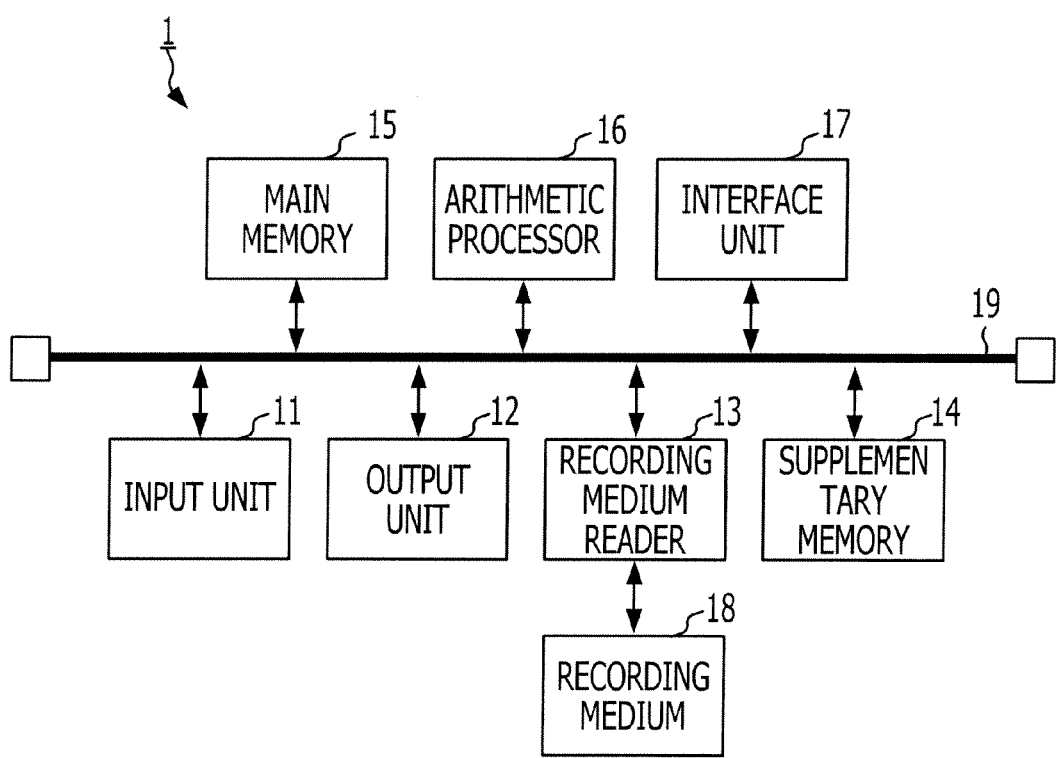
FIG. 1 is a hardware diagram of a pin placement determining device.

FIG. 1 is a hardware diagram of one example of the pin placement determining device of the present embodiment. A pin placement determining device 1 may be configured as a standalone device or may be a device connected to a user terminal and configured to be able to receive data through a network such as the Internet or a LAN.

The pin placement determining device 1 in FIG. 1 has an input unit 11, an output unit 12, a recording medium reader 13, a supplementary memory 14, a main memory 15, an arithmetic processor 16, and an interface unit 17 all interconnected by a bus 19.

The input unit 11 is a keyboard and a mouse and the like. The input unit 11 is used for inputting various types of signals. The output unit 12 is a display device and the like. The output unit 12 is used for displaying various windows and data and the like. The interface unit 17 is a modem or a LAN card and the like. The interface 17 is used for connecting to the network.

The pin placement determining program according to the present embodiment is one of various programs controlled by the pin placement determining device 1. The pin placement determining program is provided, for example, by distributing a recording medium 18 or by downloading the program from the network. The recording medium 18 recording the pin placement determining program may be one of various types of recording media such as a recording medium that records information optically, electrically, or magnetically such as a CD-ROM, a floppy disk, or a magnetic optical disk, or a semiconductor memory that records information electrically such as a ROM or flash memory.

When the recording medium 18 containing the pin placement determining program is set in the recording medium reader 13, the pin placement determining program is installed in the supplementary memory 14 through the recording medium reader 13 that reads the pin placement determining program from the recording medium 18. The pin placement determining program downloaded from the network is installed in the supplementary memory 14 through the interface unit 17. The supplementary memory 14 stores desired files and data and the like, as well as the installed pin placement determining program.

The main memory 15 reads the pin placement determining program from the supplementary memory 14 when the pin placement determining device 1 is activated and stores the pin placement determining program. The arithmetic processor 16 implements the following processes according to the pin placement determining program stored in the main memory 15.

Figure 2:
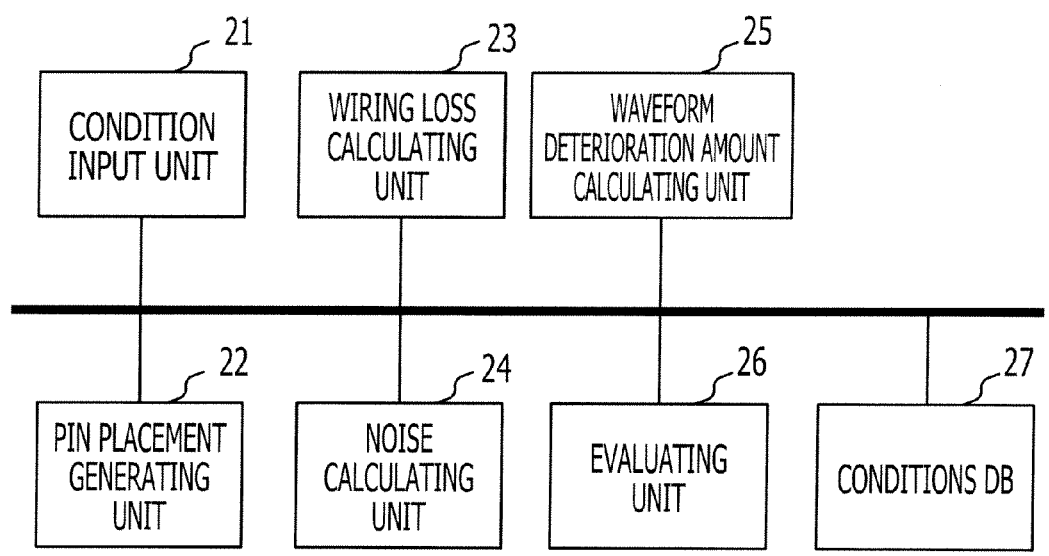
FIG. 2 is a block diagram of a pin placement determining device.

FIG. 2 is a block diagram of an example of the pin placement determining device of the present embodiment. The pin placement determining device 1 has a condition input unit 21, a pin placement generating unit 22, a wiring loss calculating unit 23, a noise calculating unit 24, a waveform deterioration amount calculating unit 25, a evaluating unit 26, and a conditions DB 27.

The condition input unit 21 accepts inputs of conditions such as connection information, PIU (plug in unit) placement, basic pin placement rules, evaluation criteria, printed board wiring loss coefficients, and the like from a user. A PIU is a printed board inserted into connectors placed on a mother board. The pin placement generating unit 22 determines temporary pin placements for connector pins and switches pins in the temporary pin placement.

The wiring loss calculating unit 23 calculates wiring length from the temporary pin placement, PIU placement, and connection information of the connectors, and then converts the wiring length to signal loss of the wiring (hereinbelow called wiring loss). The noise calculating unit 24 calculates the amount of noise for each wire from the temporary pin placement of the connectors and from the wiring loss. The waveform deterioration amount calculating unit 25 calculates, as described below, the waveform deterioration amount as an index for judging waveform quality of each wire.

The evaluating unit 26 evaluates the amount of waveform deterioration versus evaluation criteria and evaluates the effect of switching the pins in the temporary pin placement. The conditions DB 27 stores connection information, PIU placements, basic pin placement rules, evaluation criteria and other conditions inputted by the user.

Figure 3:
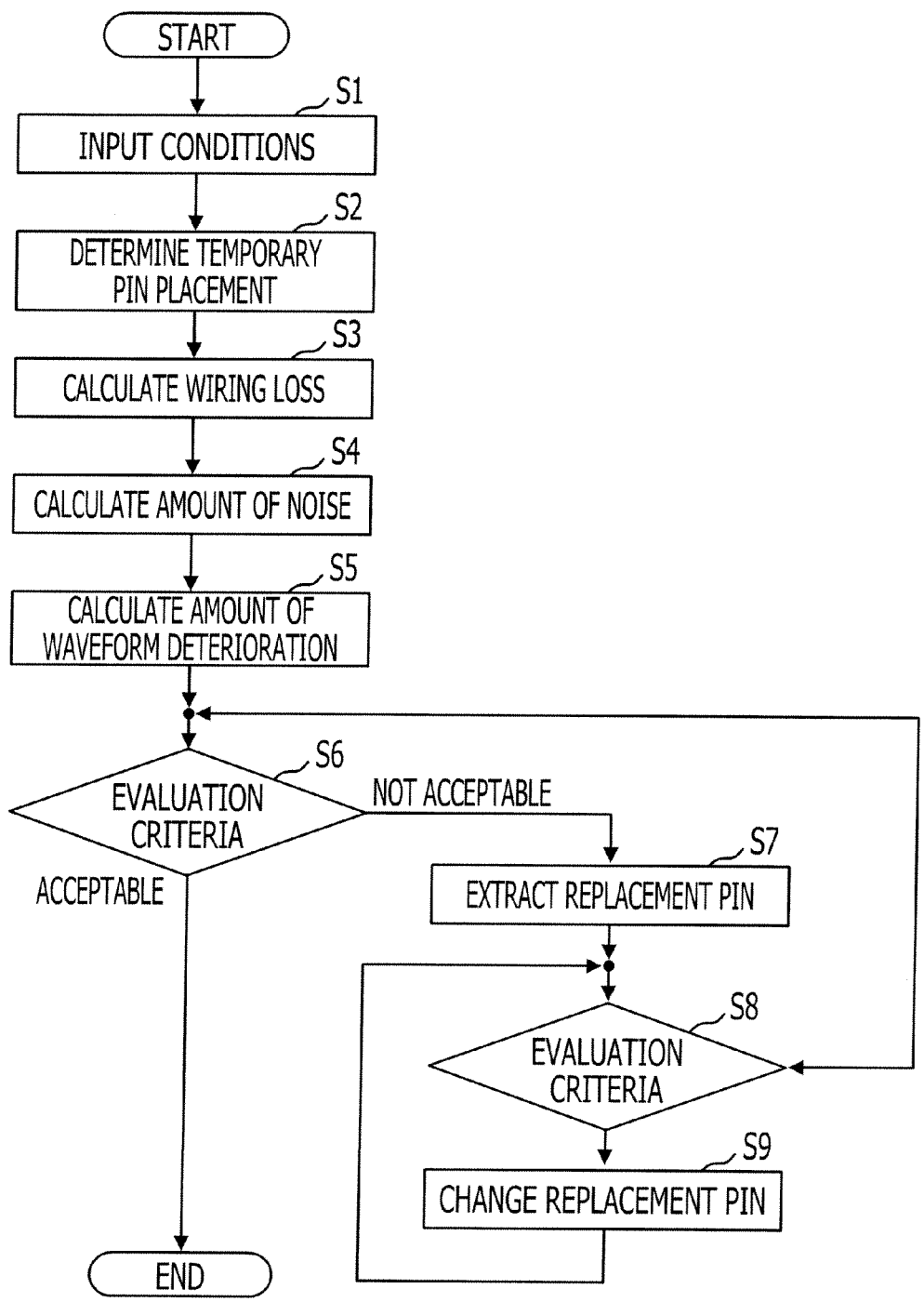
FIG. 3 illustrates pin placement determining procedures.

The pin placement determining device 1 of the present embodiment illustrated in FIG. 2 conducts processes, for example, according to the procedures in the flowchart illustrated in FIG. 3. FIG. 3 is an exemplary flowchart illustrating procedures of the pin placement determining device 1 according to the present embodiment.

In step S1, the condition input unit 21 accepts the input of connection information, PIU placements, basic pin placement rules, evaluation criteria, printed board wiring loss coefficients and the like from the user, and stores the inputted conditions in the conditions DB 27.

In step S2, the pin placement generating unit 22 determines a temporary pin placement of the connector pins. In step S3, the wiring loss calculating unit 23 derives the wiring length from the temporary pin placement, the PIU placement, and the connection information of the connectors, and then calculates the wiring loss from the wiring length.

In step S4, the noise calculating unit 24 calculates the amount of noise for each wire from the temporary pin placement of the connectors and from the wiring loss. In step S5, the waveform deterioration amount calculating unit 25 calculates the amount of waveform deterioration from the wiring loss and the noise amount as described hereinbelow as an index for judging the waveform quality of each wire.

In step S6, the evaluating unit 26 compares the amount of waveform deterioration with the evaluation criteria and makes an evaluation. If the amount of waveform deterioration is below the evaluation criteria (Acceptable), the evaluating unit 26 evaluates the waveform deterioration amount as acceptable and chooses the current temporary pin placement as the final pin placement.

If the amount of waveform deterioration exceeds the evaluation criteria (Not acceptable), the evaluating unit 26 evaluates the amount of waveform deterioration as not acceptable. If the amount of waveform deterioration exceeds the evaluation criteria, the pin placement generating unit 22 advances to step S7, extracts the pin with the least amount of noise as a replacement pin and replaces the pin in which the amount of waveform deterioration exceeds the evaluation criteria with the replacement pin. In step S8, the evaluating unit 26 evaluates the effect of replacing the pin of the temporary pin placement.

When the replacement of the pin is evaluated as effective, the evaluating unit 26 returns to step S6. If the replacement of the pin is evaluated as having no effect, the pin placement generating unit 22 advances to step S9, changes the replacement pin and returns to step S8.

In step S1, the condition input unit 21 accepts the input of various conditions such as connection information, PIU placements, basic pin placement rules, evaluation criteria, printed board wiring loss coefficients and the like. For example, the condition input unit 21 receives connection information on the wiring between PIUs as the connection information. A general netlist may be considered as the connection information for the wiring between PIUs.

Figure 4:
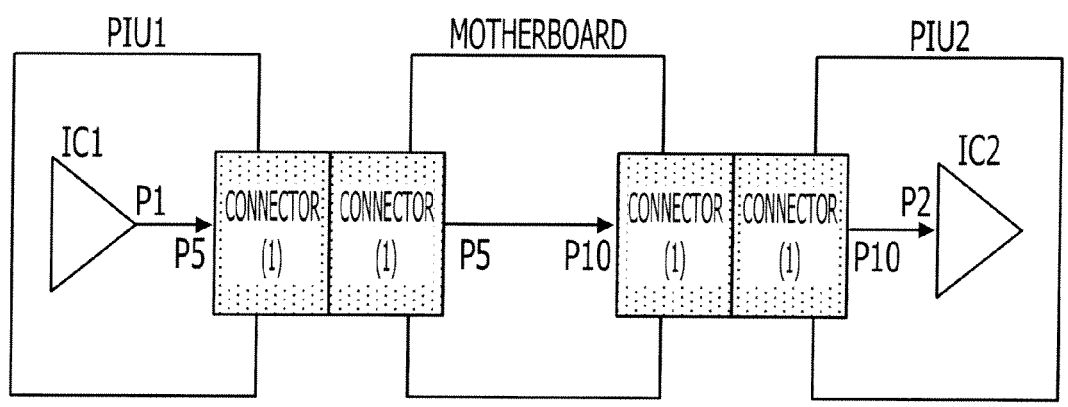
FIG. 4 is a diagram of wiring between PIUs indicated in connection information.

A conventional design CAD device may be used as a tool to create netlists. FIG. 4 is an exemplary diagram of wiring between PIUs indicated in the connection information. FIG. 5 is an exemplary diagram of a netlist indicating connection information. The netlist illustrated in FIG. 5 includes information on net numbers and two connection terminals. The connection terminal information included in the netlist includes component, terminal, and input/output type information. The input/output type is information that identifies the transmission direction of each wire.

Figure 6:
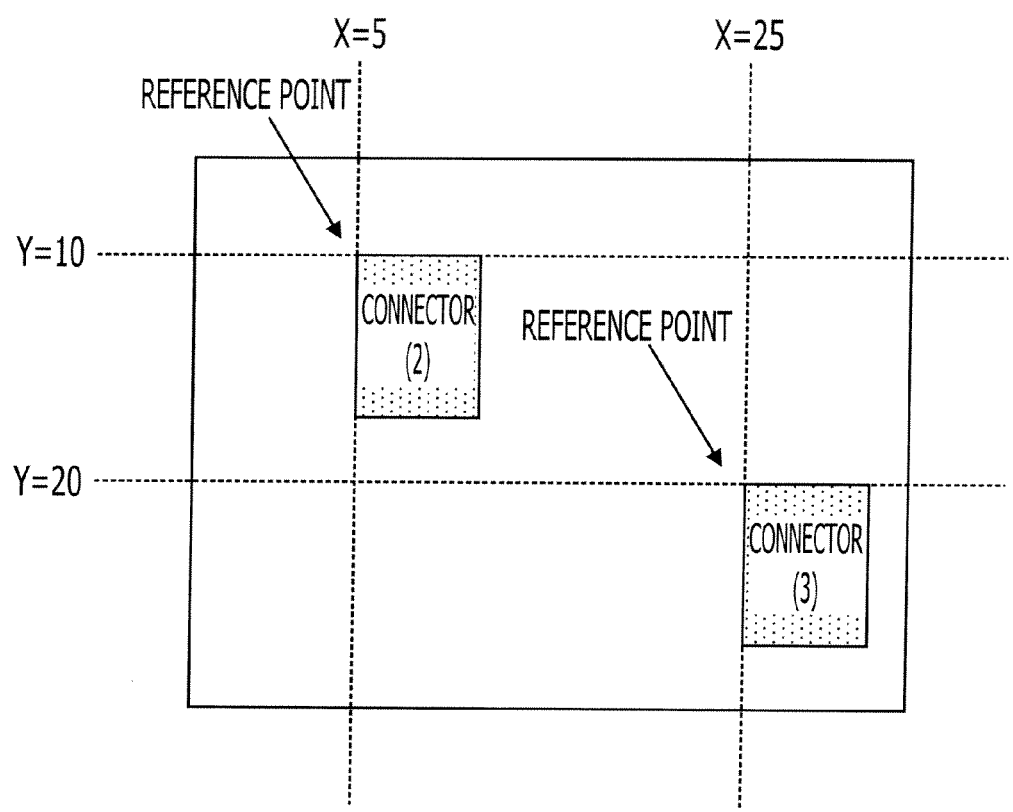
FIG. 6 is a connector placement diagram represented by a PIU placement.

The connector placement on a motherboard is inputted into the condition input unit 21 as PIU placement information. FIG. 6 is an exemplary diagram of the connector placement indicated by the PIU placement. FIG. 7 is an exemplary diagram indicating coordinate information of the PIU placement. As illustrated in FIG. 7, the PIU placement may be represented as, for example, reference point coordinates set for connectors.

Figure 8:
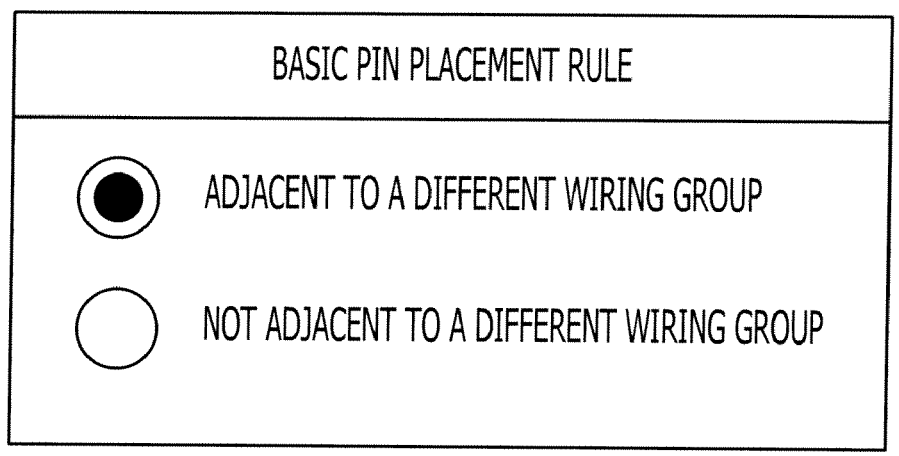
FIG. 8 illustrates a screen for inputting basic pin placement rules.

Furthermore, basic rules to reduce noise are inputted into the condition input unit 21 as basic pin placement rules. FIG. 8 is an exemplary diagram of a screen for inputting basic pin placement rules. In FIG. 8, a user is asked to select "Adjacent to a different wiring group" or "Not adjacent to a different wiring group" as the basic pin placement rule using a check box. Items for determining wiring groups include wiring (signal) transmission direction, type of connection element (transmitting and reception elements), destination PIU, and the like.

FIGS. 9A and 9B illustrate examples of pin placements when "Adjacent to a different wiring group" or "Not adjacent to a different wiring group" is selected as the basic pin placement rule. FIG. 9A illustrates the pin placement when "Adjacent to a different wiring group" is selected. FIG. 9B illustrates the pin placement when "Not adjacent to a different wiring group" is selected. For example, different wiring groups are adjacent to each other in FIG. 9A. Alternatively, different wiring groups are not adjacent to each other in FIG. 9B.

Furthermore, the condition input unit 21 receives the input of evaluation criteria for accepting or not accepting the pin placement as the evaluation criteria as illustrated in FIG. 10. FIG. 10 is an exemplary diagram of a screen for inputting evaluation criteria. In FIG. 10, the user is asked to input evaluation criteria for the amount of waveform deterioration taking into account both wiring loss and the amount of noise as evaluation criteria in a dialog box.

Figure 11:
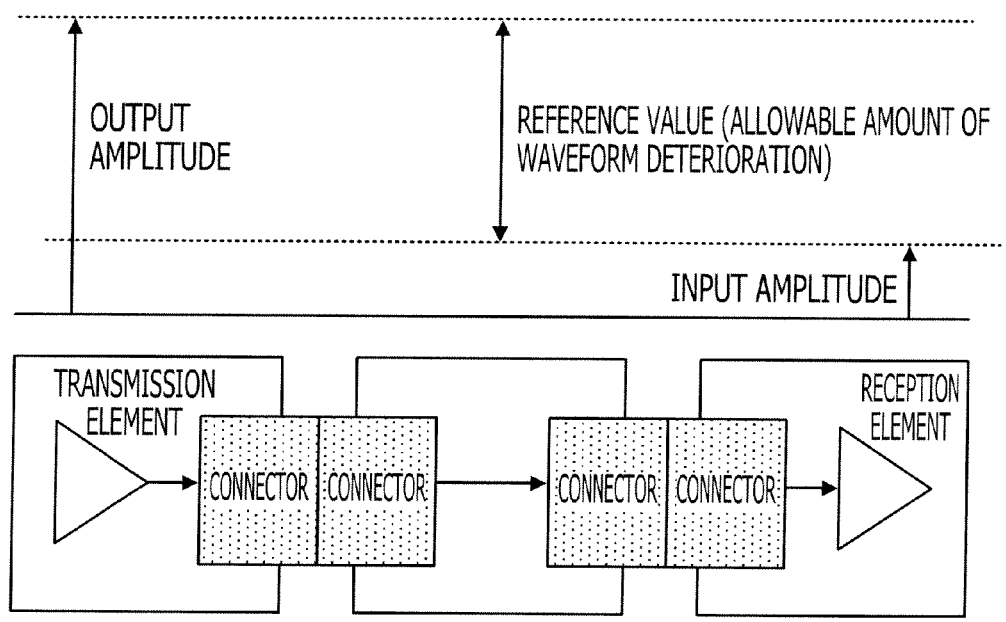
FIG. 11 illustrates a method of automatically calculating the evaluation criteria.

The evaluation criteria can be used for automatic calculation as illustrated in FIG. 11 from an output amplitude (rated) of a transmission element and an input amplitude of a reception element (rated). FIG. 11 illustrates an exemplary method of automatically calculating evaluation criteria. In FIG. 11, the difference between the output amplitude of the transmission elements and the input amplitude of the reception elements is calculated in decibels (dB) and the result is set as the evaluation criteria for the allowable amount of waveform deterioration. A method of automatically calculating the evaluation criteria illustrated in FIG. 11 may be represented by the following equation (1).

$$\text{Decision criteria (dB) for determining amount of waveform deterioration} = 20 \times \log\left(\frac{\text{input amplitude}(V) \text{ of reception elements}}{\text{output amplitude}(V) \text{ of transmission elements}}\right) \quad (1)$$

Figure 12:
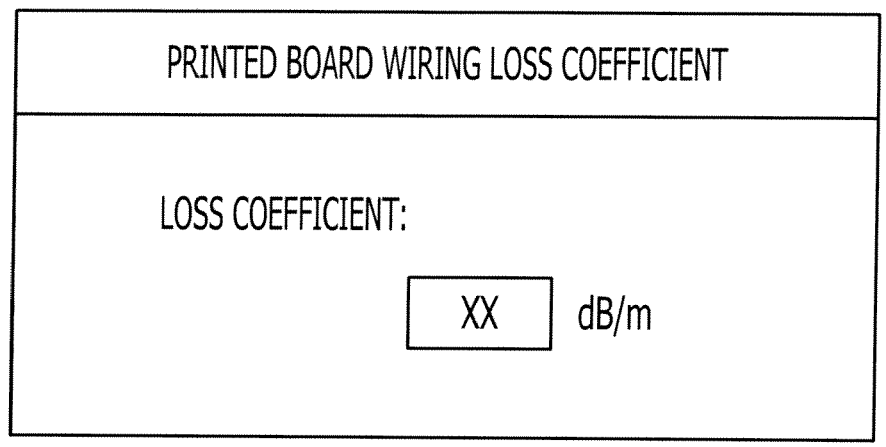
FIG. 12 is a screen for inputting a printed board wiring loss coefficient.

Furthermore, the condition input unit 21 receives the printed board wiring loss coefficient as illustrated in FIG. 12. FIG. 12 is an exemplary diagram of a screen for inputting the printed board wiring loss coefficient. The printed board wiring loss coefficient is a coefficient for converting printed board wiring length to signal loss of the wiring. The units for the printed board wiring loss coefficient in FIG. 12 is dB/m.

In step S2, the pin placement generating unit 22 determines the pin placement according to the inputted basic pin placement rules. The pin placement generating unit 22 determines the temporary pin placement with the smallest straight line distance from connection distances between connected PIUs ranked according to physically large distances. For example, the pin placement generating unit 22 determines a temporary pin placement of connector pins according to the flowchart illustrated in FIG. 13.

Figure 13:
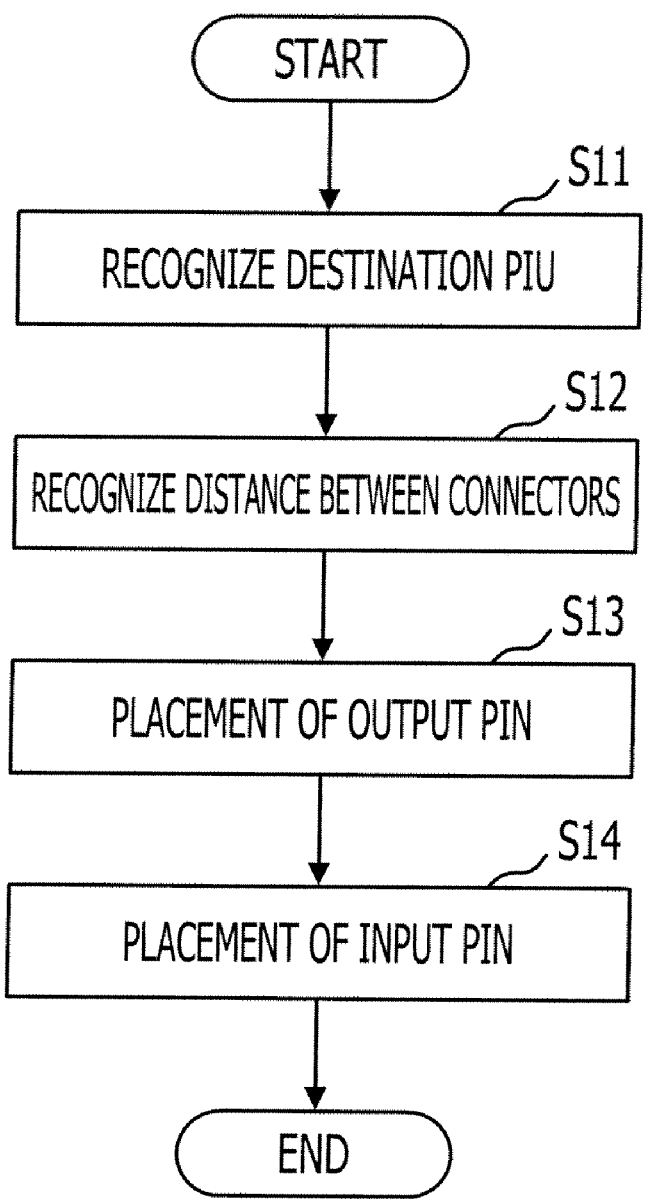
FIG. 13 illustrates the procedures of step S2.

FIG. 13 is an exemplary flowchart illustrating the procedures in step S2. In step S11, the pin placement generating unit 22 recognizes the destination PIU. In step S12, the pin placement generating unit 22 recognizes the distance between the connectors. In step S13, the pin placement generating unit 22 places the output pin according to the basic pin placement rules. Furthermore, in step S14, the pin placement generating unit 22 places the input pin according to the basic pin placement rules.

Figure 14:
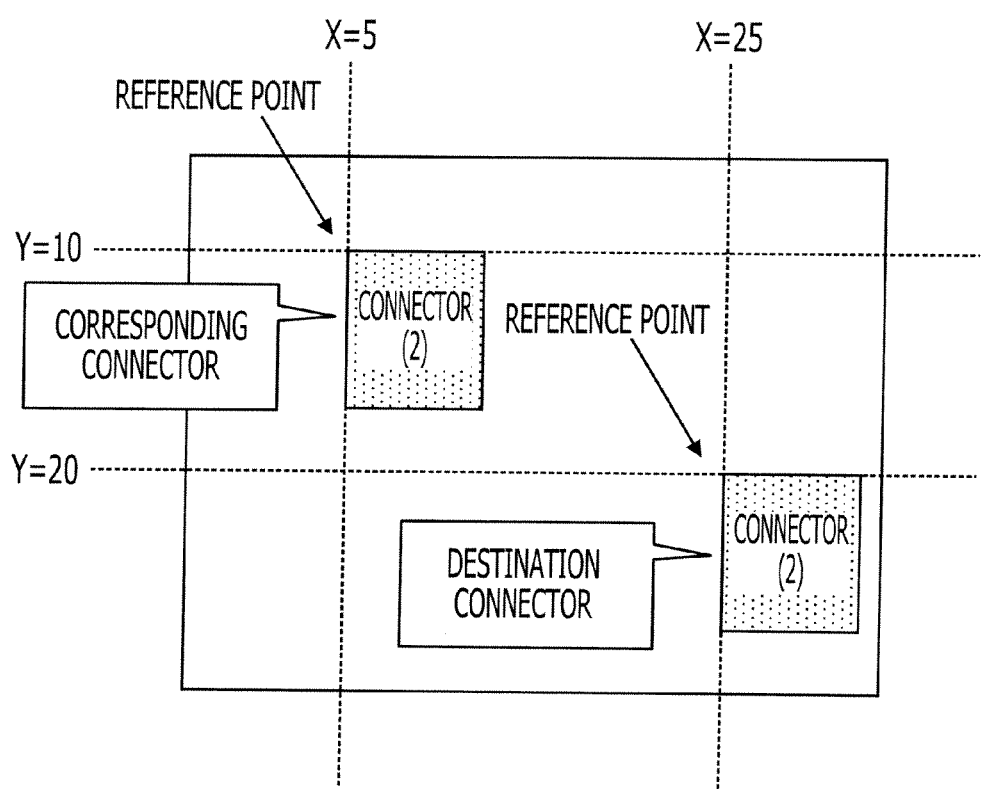
FIG. 14 is an exemplary diagram of a process to recognize a destination PIU.

FIG. 14 is an exemplary image of a process to recognize a destination PIU. The pin placement generating unit 22 recognizes the PIU connected to the corresponding connector from the inputted connection information. For example, in the example illustrated in FIG. 14, the destination PIU is recognized from the destination connector (3) connected to the corresponding connector (2).

Figure 15:
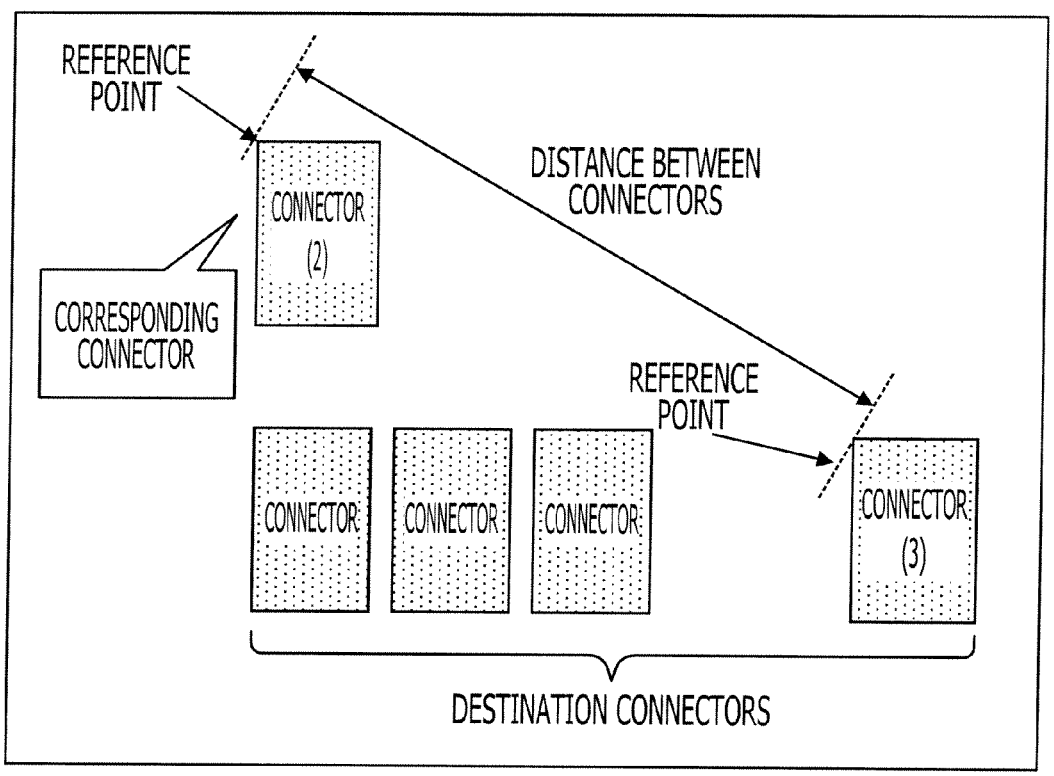
FIG. 15 illustrates a process to recognize a distance between connectors.

FIG. 15 is an exemplary image of a process to recognize the distance between connectors. The pin placement generating unit 22 recognizes reference point coordinates set for the corresponding connector and the destination connector from the coordinate information illustrated in FIG. 7 for all the destination connectors recognized from the inputted connection information (e.g., a netlist), and then recognizes a straight line distance between the reference points of the corresponding connector and the destination connector as the distance between the connectors.

Figure 16:
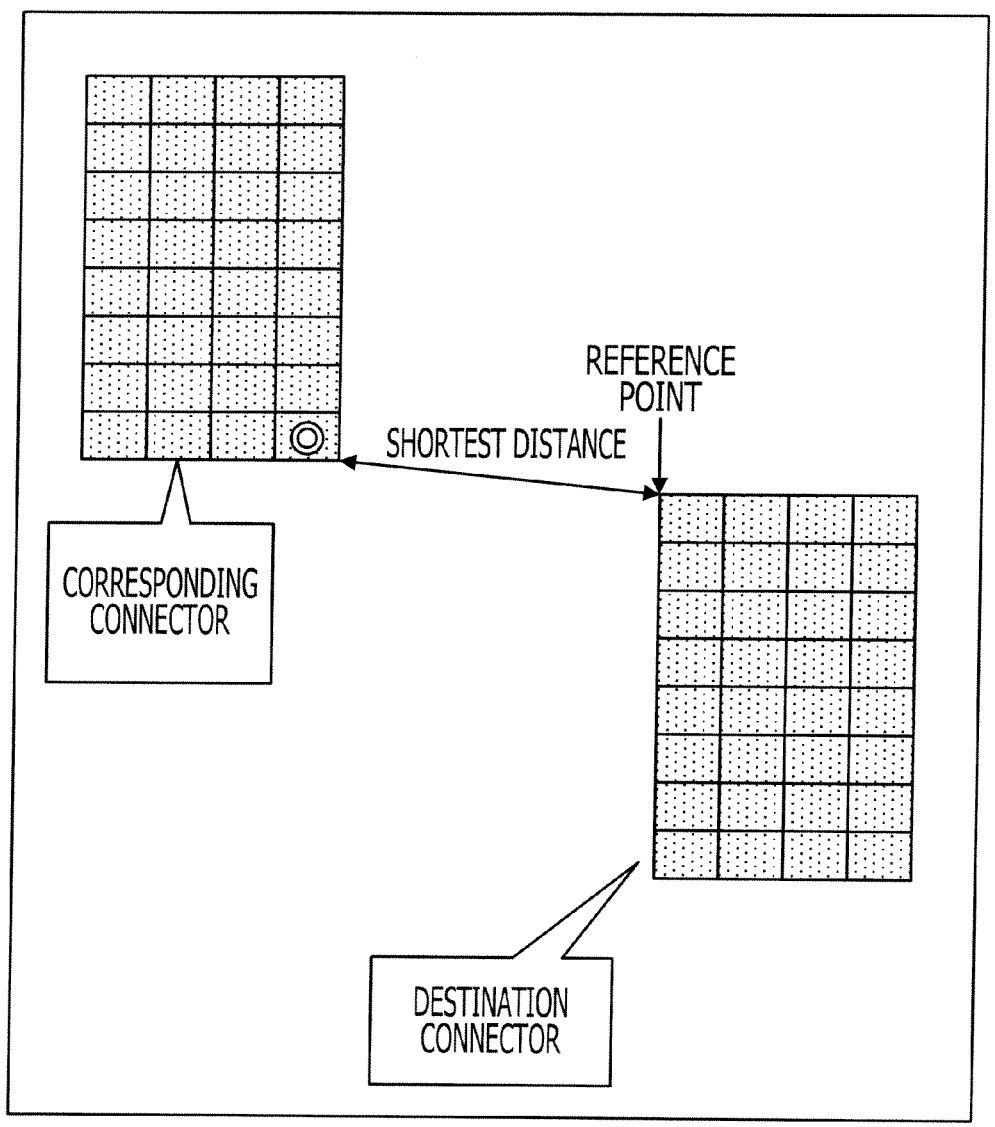
FIG. 16 illustrates a process for placing an output pin.

FIG. 16 is an exemplary image of a process for placing an output pin. The pin placement generating unit 22 makes a temporary placement of an output pin in order from connectors with long distances therebetween recognized in step S12. The pin placement generating unit 22 assigns the corresponding signal to a corresponding pin (the pin indicated with a double circle in FIG. 16) of the corresponding connector with the shortest straight line distance to the reference point of the connector (destination connector) of the destination PIU.

The pin placement generating unit 22 evaluates whether the adjacent pins are input or output types in the determined temporary pin placement when "Not adjacent to a different wiring group" (for example, signal transmission direction) is selected for the basic pin placement rules. The pin placement generating unit 22 cancels the candidacy of the corresponding pin if the corresponding pin and the adjacent pins are different input/output types, and then searches for the next candidate using the same method.

Figure 17:
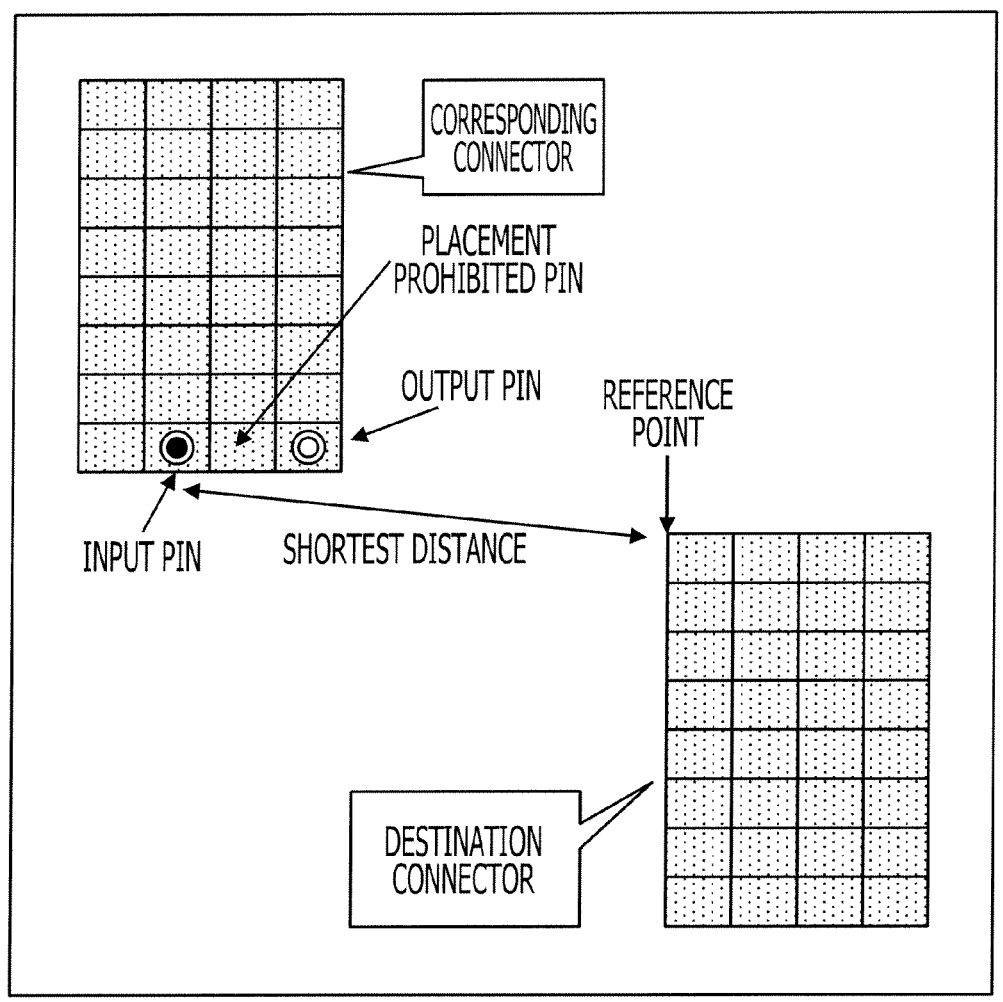
FIG. 17 illustrates a process for placing an input pin.

FIG. 17 is an exemplary image of a process for placing an input pin. Similar to the process described above for the output pin, the pin placement generating unit 22 makes a temporary pin placement of an input pin in order from connectors with long distances therebetween recognized in step S12. In FIG. 17, output pins and input pins and the like are represented as placement prohibited pins when "not adjacent to a different wiring group" (for example, signal transmission direction) is selected.

Figure 18:
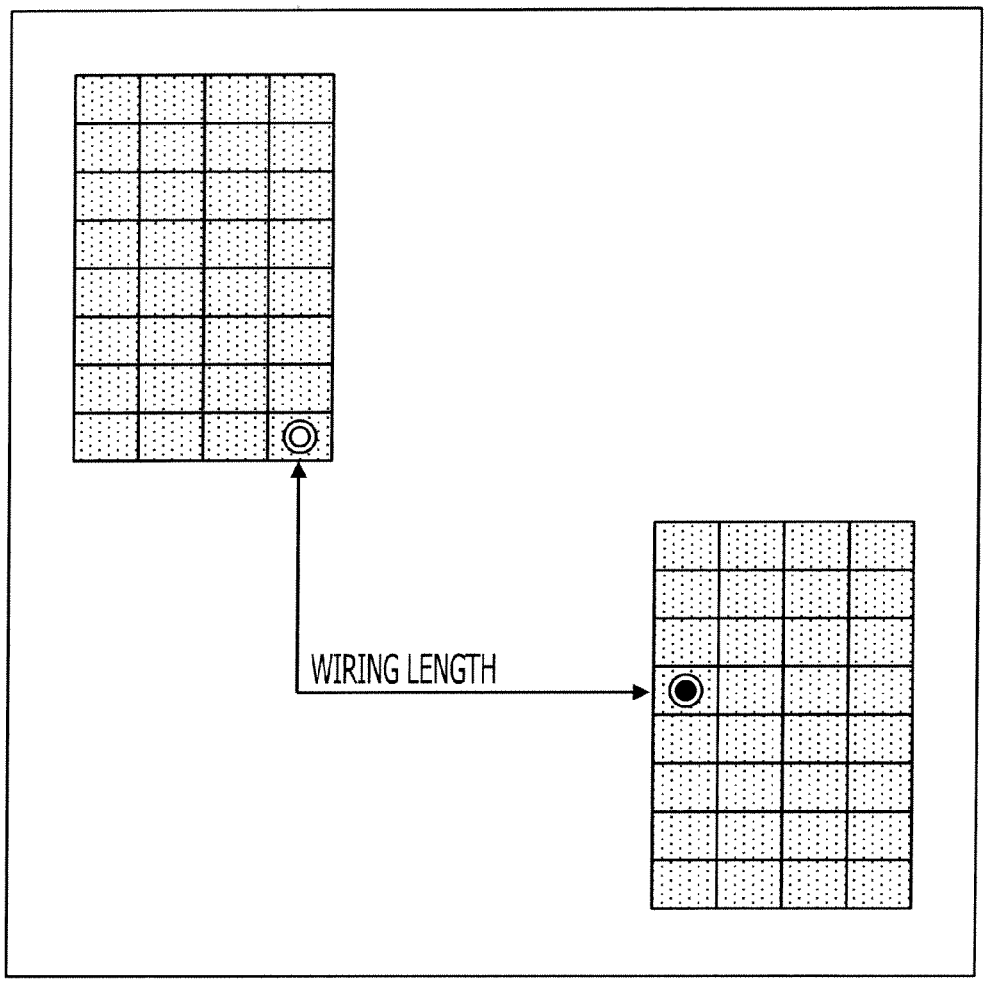
FIG. 18 illustrates a process for calculating the wiring length of wires.

In step S3, the wiring loss calculating unit 23 derives the wiring length of each wire in the temporary pin placement and calculates the wiring loss from the wiring lengths. FIG. 18 is an exemplary diagram of a process for calculating the wiring length of wires. The wiring loss calculating unit 23 calculates the wiring lengths using right angle bends and the minimum number of bends. The wiring loss calculating unit 23 the wiring loss of wires from the following equation (2) based on the calculated wiring length and the printed board wiring loss coefficient inputted as a condition. The wiring length calculation may also be conducted using functions from commercially sold automatic wiring tools and the like.

$$\text{Wiring loss (dB)} = \text{wiring length (m)} \times \text{printed board wiring loss coefficient (dB/m)} \quad (2)$$

In step S4, the noise calculating unit 24 calculates the noise generated at the corresponding connector from the wiring loss and the temporary pin placement for each wire. The noise calculating unit 24 may use an existing method to calculate the noise generated at the corresponding connector. An example of the process to calculate noise generated at the corresponding connector is illustrated in FIG. 19.

FIG. 19 is an exemplary diagram of a process to calculate noise. The noise calculating unit 24 may calculate noise under corresponding conditions from a database that indicates a noise source and noise attenuation using the wiring loss and noise generation of a connector body. For example, in the noise calculation process illustrated in FIG. 19, noise is calculated according to a difference in the amplitude of the noise source, a difference in the wiring length, and a difference in the input/output type.

Table 51 illustrates the amount of crosstalk at the pin position of each connector. A corresponding net in the Table 51 represents the corresponding pin for calculating the amount of noise. For example, "Type A: 1%" indicates an input/output type A pin that contributes 1% of the noise to the corresponding pin.

The noise calculating unit 24 tallies the respective types in the Table 51 to arrive at a total of 5% for type A and 7% for type B. Further, the noise calculating unit 24 converts the type A 5% total and the type B 7% total to a percentage of the total amount of crosstalk and arrives at 42% for type A and 58% for type B.

The noise calculating unit 24 equalizes the noise source amplitude and wiring length based on the percentages and then integrates the noise source amplitude and wiring length. Then, the noise calculating unit 24 may derive a final noise amount with a waveform simulation from a simplified model according to the integration.

In step S5, the waveform deterioration amount calculating unit 25 calculates the amount of waveform deterioration as an index for judging waveform quality of each wire from both the wiring length and the amount of noise. The amount of waveform deterioration can be derived by adding a value of deterioration due to noise calculated in decibels using a common method, to the wiring length loss as illustrated in equation (3).

$$\text{Amount of waveform deterioration (dB)} = \text{wiring loss (dB)} + \text{deterioration due to noise (dB)} \quad (3)$$

The value of deterioration due to noise calculated in decibels using a common method can be derived using equation (4). The equation (4) can be used for deriving a differential of the allowable amount of waveform deterioration when noise exists or does not exist. The input amplitude and the output amplitude in equation (4) refer respectively to the input amplitude of the reception elements and the output amplitude of the transmission elements.

$$\text{Amount of deterioration (dB) due to noise} = \quad (4)$$
$$20 \times \log\left(\frac{\text{input amplitude}(V) + \text{noise}(V)}{\text{output amplitude}(V)}\right) -$$
$$20 \times \log\left(\frac{\text{input amplitude}(V)}{\text{output amplitude}(V)}\right)$$

The input amplitude (V) can be derived using equation (5).

$$\text{Input amplitude}(V) = \quad (5)$$
$$(\text{output amplitude of transmission elements}) \times 10^{\frac{\text{wiring loss(dB)}}{20}}$$

FIG. 20 is an exemplary diagram of a process to calculate the amount of waveform deterioration. The waveform deterioration amount calculating unit 25 calculates the amount of waveform deterioration due to both wiring loss and the amount of noise using addition as illustrated in FIG. 20.

In step S6, the evaluating unit 26 extracts the wire with largest amount of deterioration from the calculated amount of waveform deterioration of each wire, compares the extracted amount of waveform deterioration to the evaluation criteria stored in the conditions DB 27 to conduct an evaluation. The process to extract the wire with the largest amount of waveform deterioration from among the calculated amounts of waveform deterioration of each wire may use, for example, a MAX function included in a common program.

If the amount of waveform deterioration is below the evaluation criteria (Acceptable), the evaluating unit 26 evaluates the waveform deterioration amount as acceptable and determines that the current temporary pin placement is the final pin placement. Furthermore, if the amount of waveform deterioration exceeds the evaluation criteria (Not acceptable), the evaluating unit 26 evaluates the amount of waveform deterioration as not acceptable and proceeds to step S7.

In step S7, the pin placement generating unit 22 extracts the pin with the lowest amount of noise as the replacement pin for the PIU in which the wire that is evaluated in step S6 to have an amount of waveform deterioration exceeding the evaluation criteria is included. The pin placement generating unit 22 replaces the pin for which the amount of waveform deterioration exceeds the evaluation criteria with the extracted replacement pin. If there are multiple connectors housed therein, the pin placement generating unit 22 conducts the process in step S7 for the respective connectors with wiring that is evaluated in step S6 as having an amount of waveform deterioration that exceeds the evaluation criteria.

Figure 21:
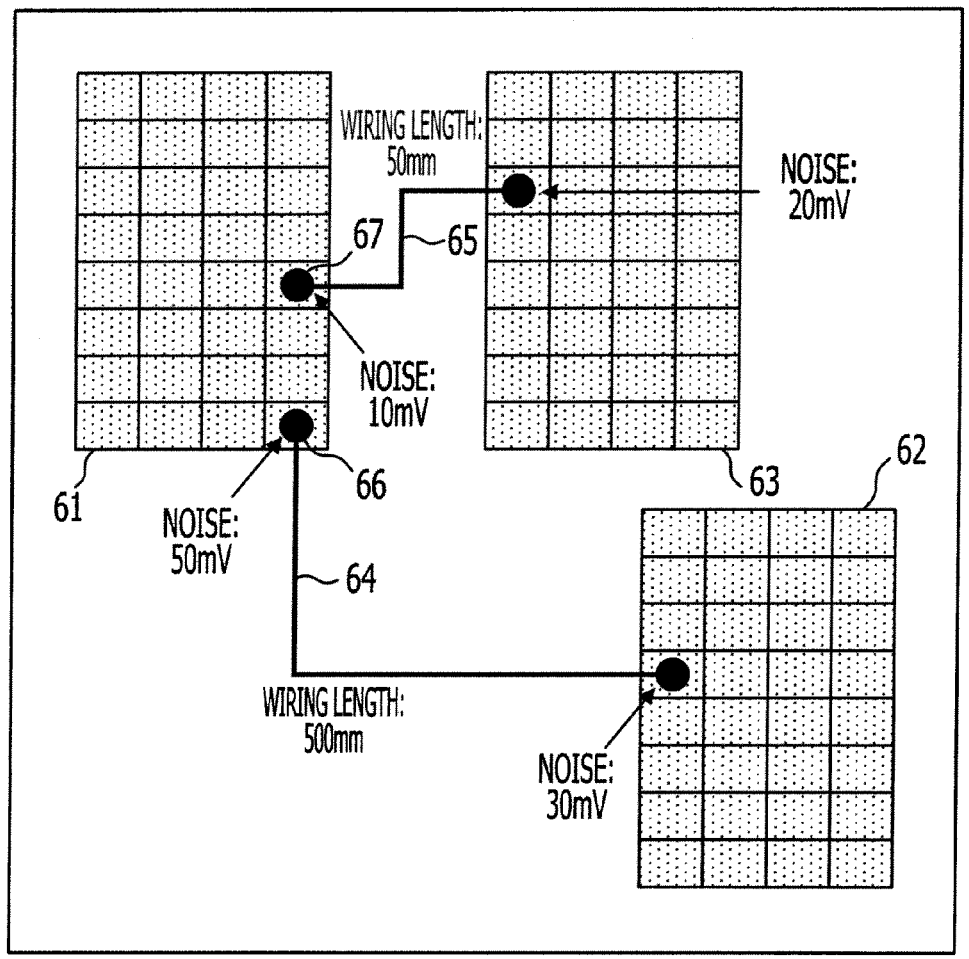
FIG. 21 is a diagram of processing before the step S7 process.
Figure 22:
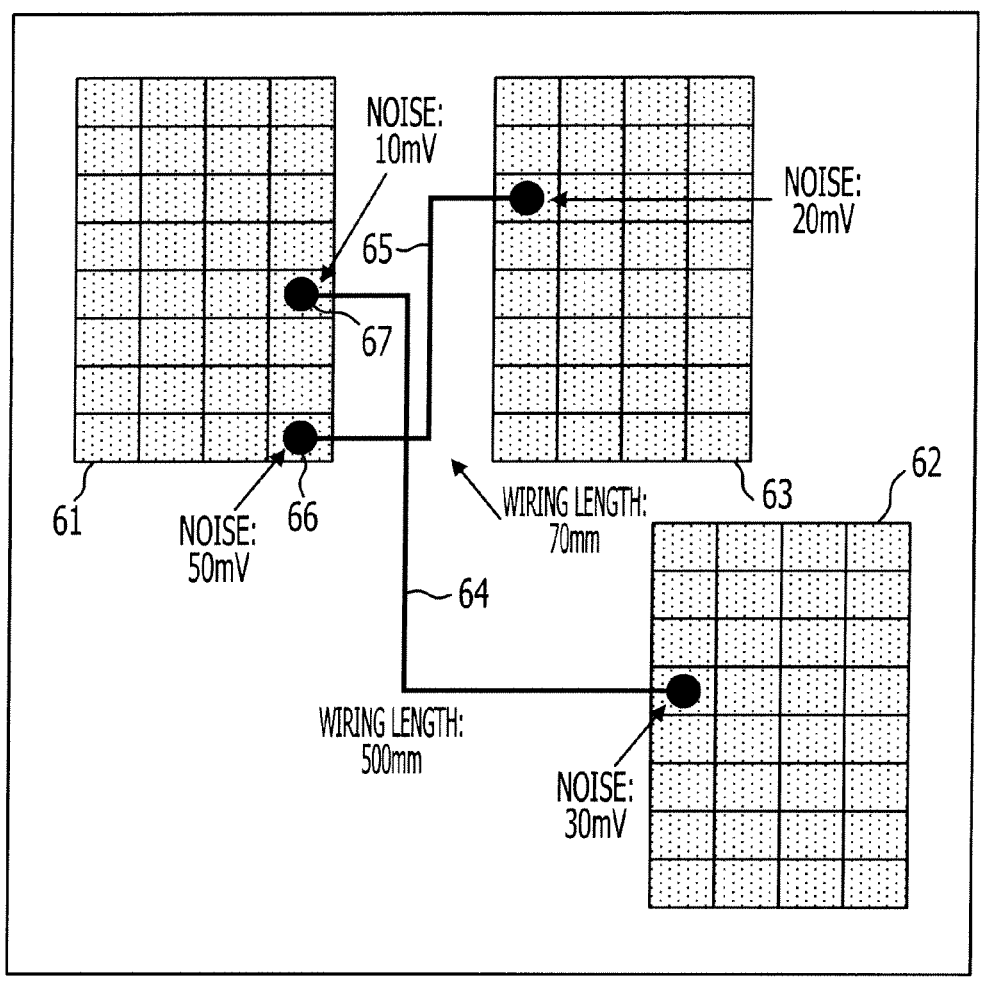
FIG. 22 is a diagram of processing after the step S7 process.

FIG. 21 is an exemplary diagram of processing before the process in step S7. FIG. 22 is an exemplary diagram of processing after the process in step S7. In FIG. 21, a pin 66 of a corresponding connector 61 is connected to a destination connector 62 by a wire 64. Further, in FIG. 21 a pin 67 of the corresponding connector 61 is connected to a destination connector 63 by a wire 65.

The amount of waveform deterioration of the wire 64 is evaluated as exceeding the evaluation criteria. The pin placement generating unit 22 extracts, for example, the pin 67 with the lowest amount of noise as the replacement pin in the corresponding connector 61 to which the wire 64 that is evaluated as having an amount of waveform deterioration that exceeds the evaluation criteria, is connected. The pin placement generating unit 22 replaces the pin 66 for which the amount of waveform deterioration exceeds the evaluation criteria with the extracted replacement pin 67.

In FIG. 22 that illustrates the process after step S7, the pin 66 of the corresponding connector 61 is connected to the destination connector 63 by the wire 65. Further, in FIG. 22, the pin 67 of the corresponding connector 61 is connected to the destination connector 62 by the wire 64. In this way, the pin placement generating unit 22 replaces the pin in which the amount of waveform deterioration exceeds the evaluation criteria with the pin with the lowest amount of noise.

In step S8, the evaluating unit 26 re-calculates the amount of waveform deterioration of both wires for the replaced pins of the connectors. The evaluating unit 26 evaluates the replacement as effective if both of the amounts of waveform deterioration of the wires are below the amount of waveform deterioration of the wire with the largest amount of waveform deterioration extracted in step S6, and returns to step S6. Further, the evaluating unit 26 evaluates the switching as not effective if at least one of the amounts of waveform deterioration of the wires exceed the amount of waveform deterioration of the wire with the largest amount of waveform deterioration extracted in step S6, and advances to step S9.

FIGS. 23A and 23B are exemplary explanations of the evaluation processing in step S8. FIG. 23A illustrates results of calculations of the amount of waveform deterioration and the conditions before the replacement of the pins by the pin placement generating unit 22. The largest amount of waveform deterioration among the amounts of waveform deterioration of the wires before the replacement of the pins is 12.9 dB which exceeds the evaluation criteria of 12.0 dB.

FIG. 23B illustrates results of calculations of the amount of waveform deterioration and the conditions after the replacement of the pins by the pin placement generating unit 22. The largest amount of waveform deterioration among the amounts of waveform deterioration of the wires after the replacement of the pins is 11.6 dB. The evaluating unit 26 evaluates the replacement of the pins as effective since the largest amount of waveform deterioration after the replacement of the pins is 11.6 which is lower than the largest amount of waveform deterioration before the replacement of the pins.

In step S9, the pin placement generating unit 22 extracts a new replacement pin that has the next lowest amount of noise compared to the amount of noise of the current replacement pin, and then returns to step S8.

In the above-mentioned embodiments, the evaluations occurring in step S6 to step S9 occur using a general index that considers both the wiring loss and the amount of noise. By contrast, the accuracy of the evaluations occurring in step S6 to step S9 can be improved by conducting a waveform simulation. Furthermore, freedom in selecting improvement strategies can be improved when conducting waveform simulations since the effects of transmission and reception element loss compensation functions such as pre-emphasis and equalization can be incorporated.

Figure 24:
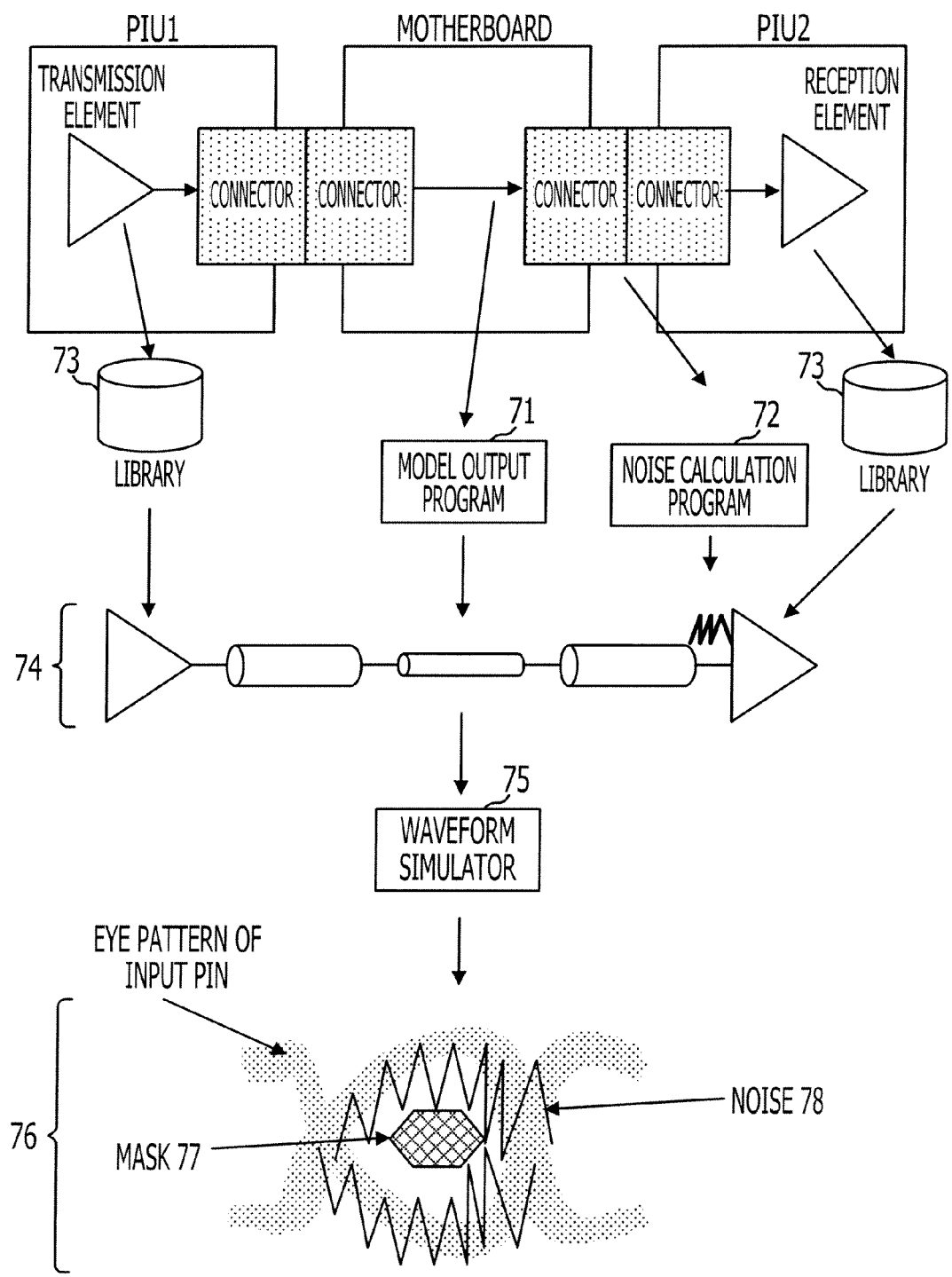
FIG. 24 illustrates evaluation processing using waveform simulation in steps S6 to S9.

FIG. 24 illustrates an exemplary explanation of evaluation processing in steps S6 to S9 using waveform simulation. In the example in FIG. 24, an eye pattern 76 of an input pin can be derived by using a model output program 71, a noise calculation program 72, and a library 73 to create desired data 74 in a waveform simulation, and then inputting the data 74 into a waveform simulator 75.

The eye pattern 76 is represented by a mask 77 and noise 78. An eye pattern 76 in which noise 78 does not overlap the mask 77 represents an allowable amount of waveform deterioration. An eye pattern 76 in which noise 78 overlaps the mask 77 represents an unallowable amount of waveform deterioration.

In the above-mentioned embodiments, a pin with the minimum amount of noise replaces the pin that has the largest amount of waveform deterioration among the pins for which the amount of waveform deterioration exceeds the evaluation criteria. Then the effect of the replacement of the pins is evaluated for the temporary pin placement. By contrast, in the process in step S7, the calculation steps can be reduced and the time can be shortened by replacing all the pins for which the amount of waveform deterioration exceeds the evaluation criteria, with the same number of pins with less amounts of noise.

FIG. 25 illustrates an example of a process of replacing all the pins with an amount of waveform deterioration exceeding the evaluation criteria with the same number of pins with less amounts of noise. FIG. 25 illustrates examples of pins in an order in which the pins that exceed the evaluation criteria are ranked in the first to the third positions. In FIG. 25, the top three ranking pins are replaced with the same number of pins for which the amount of waveform deterioration is below the evaluation criteria (for example, the bottom three ranking pins).

Figure 26:
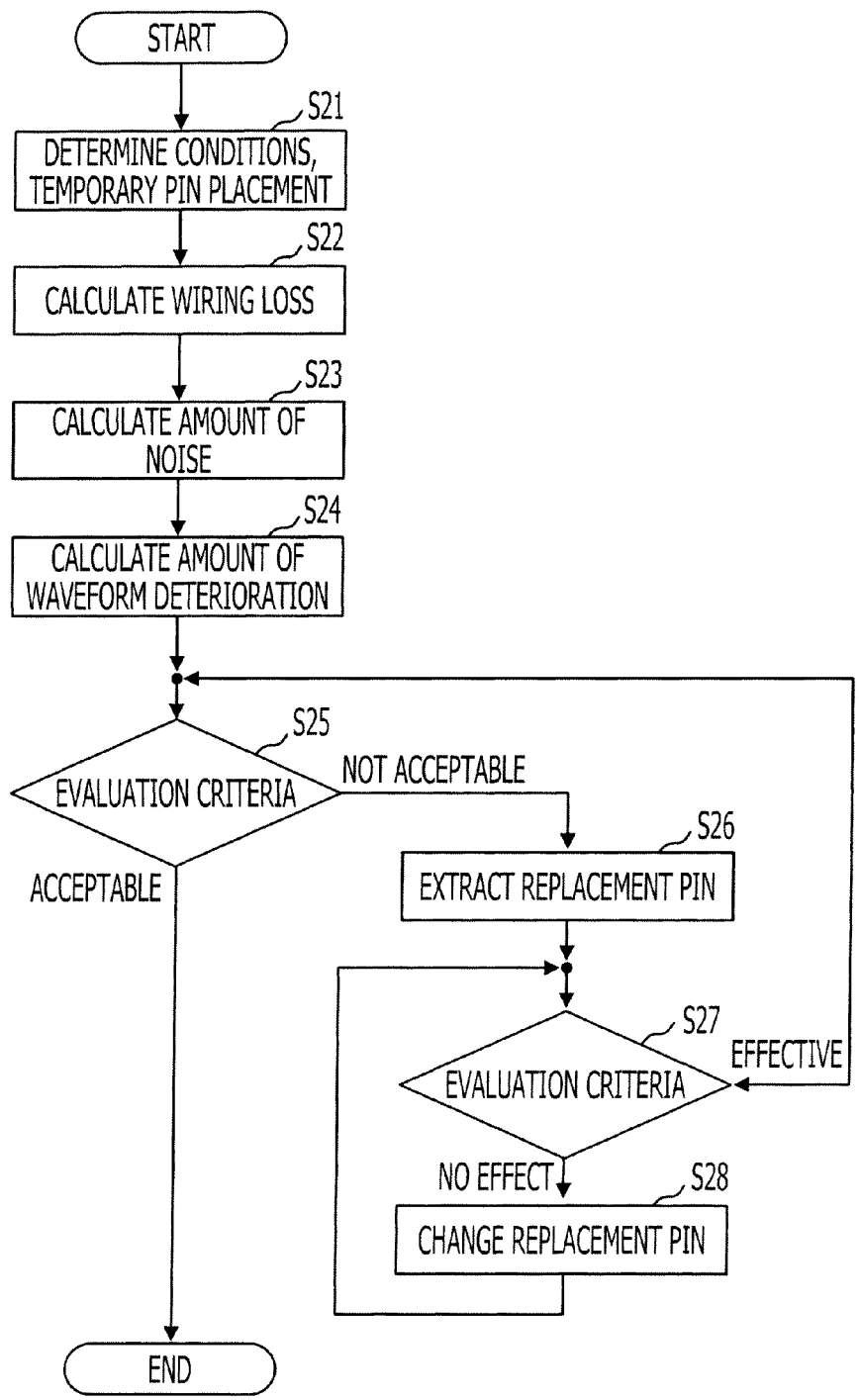
FIG. 26 illustrates another process of the pin placement determining device.

FIG. 26 is an exemplary flowchart illustrating another process of the pin placement determining device of the present embodiment. Since the flowchart illustrated in FIG. 26 is similar to the flowchart illustrated in FIG. 3 except for some parts, explanations of the similar parts will be appropriately omitted.

In the flowchart in FIG. 26, a temporary pin placement determined by a user is set as an initial value and the amount of waveform deterioration is improved through replacement of the temporary pin placement. In the flowchart illustrated in FIG. 26, processing time can be shortened by using a pin placement in, for example, a similar printed board.

In step S21, the condition input unit 21 accepts the input of connection information, PIU placements, basic pin placement rules, evaluation criteria, printed board wiring loss coefficients and other conditions as well as a temporary pin placement from the user, and stores the inputted conditions in the conditions DB 27. The processing from step S22 onwards is similar to steps S3 to S9 illustrated in FIG. 3 and the description will be omitted here.

Using the pin placement determining device 1 of the present embodiment, the generation of user reworking can be suppressed by determining a connector pin placement using an evaluation criteria for evaluating the amount of waveform deterioration considering both wiring loss and the amount of noise.

The pin placement determining method of the present embodiment may be achieved by an online service or the like. The pin placement determining program of the present embodiment may be supplied using package software or downloading and the like. The pin placement determining program of the present embodiment may implemented by a batch file function or the like.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Although the embodiments of the present inventions have been described in detail, it should be understood that various changes, substitutions, and alterations could be made hereto without departing from the spirit and scope of the invention.

The invention claimed is:

1. A pin placement determining method enabled by a computer, the method comprising:
   calculating, using a computer, a waveform deterioration amount of wires from a noise amount of the wires and wiring loss of the wires, the wires being coupled to a connector on a printed board;
   comparing the calculated waveform deterioration amount of the wires to an evaluation criteria;
   evaluating the wires in which the waveform deterioration amount exceeds the evaluation criteria; and
   replacing corresponding pins of the connectors to which the wires that have been evaluated as exceeding the evaluation criteria are coupled with replacement pins of connectors that have a low noise amount whereby the waveform deterioration amount is evaluated as being lower than the evaluation criteria.

2. A non-transitory computer-readable storage medium storing a pin placement determining program which when executed by a computer causes the computer to execute:
   calculating a waveform deterioration amount of wires from a noise amount of the wires and wiring loss of the wires, the wires being coupled to a connector on a printed board;
   comparing the calculated waveform deterioration amount of the wires to an evaluation criteria;
   evaluating the wires in which the waveform deterioration amount exceeds the evaluation criteria; and
   replacing corresponding pins of the connectors to which the wires that have been evaluated as exceeding the evaluation criteria are coupled with replacement pins of connectors that have a low noise amount whereby the waveform deterioration amount is evaluated as being lower than the evaluation criteria.

3. The non-transitory computer-readable storage medium according to claim 2, wherein the calculating the waveform deterioration amount includes calculating the waveform deterioration amount by adding a numerical value of the noise amount converted to decibels to the wiring loss.

4. The non-transitory computer-readable storage medium according to claim 3, wherein the computer further executes:
   calculating a wiring length of each wire from connection information, and
   calculating wiring loss of each wire according to the wiring length and a wiring loss coefficient of the wiring on the printed board.

5. The non-transitory computer-readable storage medium according to claim 4, wherein the computer further executes:
   calculating a noise amount generated at a connector coupled to each wire from a pin placement of the connector and the wiring loss.

6. The non-transitory computer-readable storage medium according to claim 3, wherein the replacing the pin placements includes changing the replacement pins of the connector in order from the lowest noise amount, until the waveform deterioration amount of the corresponding pin of the connector coupled to the wire evaluated as exceeding the evaluation criteria, can be evaluated as being lower than the evaluation criteria.

7. The non-transitory computer-readable storage medium according to claim 3, wherein the computer further executes:
   determining a temporary pin placement of the connector according to a basic pin placement rule selected from a choice of being adjacent to a different wiring group and not being adjacent to a different wiring group.

8. The non-transitory computer-readable storage medium according to claim 7, wherein the wiring group is determined from at least one of a transmission direction of a wire, a type of connector element, and a destination plug-in unit.

9. The non-transitory computer-readable storage medium according to claim 3, wherein the evaluating includes evaluating a wire in which the waveform deterioration amount exceeds the evaluation criteria using waveform simulation.

10. A pin placement determining device determining a pin placement of a connector, the device comprising:
    a waveform deterioration amount calculation unit configured to calculate a waveform deterioration amount of wires from a noise amount of the wires and wiring loss of the wires, the wires being coupled to a connector on a printed board;
    an evaluating unit configured to compare the calculated waveform deterioration amount of each wire to an evaluation criteria and evaluates wires in which the waveform deterioration amount exceeds the evaluation criteria; and
    a pin placement replacing unit configured to replace corresponding pins of the connector to which the wires that have been evaluated as exceeding the evaluation criteria are coupled, with replacement pins of connectors that have a low noise amount so that the waveform deterioration amount is evaluated as being lower than the evaluation criteria.

* * * * *